United States Patent
Zhong et al.

(10) Patent No.: US 6,528,997 B2
(45) Date of Patent: Mar. 4, 2003

(54) INTERMOLECULAR MULTIPLE-QUANTUM COHERENCE MR IMAGING IN HUMANS

(75) Inventors: Jianhui Zhong, Pittsford, NY (US); Zhong Chen, Rochester, NY (US); Wingchi E. Kwok, Rochester, NY (US)

(73) Assignee: University of Rochester, Rochester, NY (US)

(*) Notice: Subject to any disclaimer, the term of this patent is extended or adjusted under 35 U.S.C. 154(b) by 0 days.

(21) Appl. No.: 09/811,831

(22) Filed: Mar. 20, 2001

(65) Prior Publication Data

US 2001/0050558 A1 Dec. 13, 2001

Related U.S. Application Data

(60) Provisional application No. 60/190,093, filed on Mar. 20, 2000.

(51) Int. Cl.[7] ................................................. G01V 3/00
(52) U.S. Cl. ...................................... 324/307; 324/309
(58) Field of Search ................................ 324/309, 307, 324/314, 312, 300, 316

(56) References Cited

U.S. PATENT DOCUMENTS

| | | | | |
|---|---|---|---|---|
| 4,843,321 A | * | 6/1989 | Sotak | 324/309 |
| 4,918,387 A | * | 4/1990 | McKinnon et al. | 324/309 |
| 4,962,357 A | * | 10/1990 | Sotak | 324/309 |
| 5,317,264 A | * | 5/1994 | Rommel et al. | 324/309 |
| 5,818,230 A | * | 10/1998 | Katz et al. | 324/309 |
| 6,373,250 B1 | * | 4/2002 | Tsoref et al. | 324/309 |
| 2001/0050558 A1 | * | 12/2001 | Zhong et al. | 324/307 |

* cited by examiner

*Primary Examiner*—Edward Lefkowitz
*Assistant Examiner*—Tiffany A. Fetzner
(74) *Attorney, Agent, or Firm*—Blank Rome LLP

(57) ABSTRACT

In nuclear magnetic resonance imaging of the human brain or the like, multiple quantum coherences, such as intermolecular double quantum coherence (iDQC) between water molecules, are used for soft tissue contrast. A group of pulse sequences are used in which, (a) The standard $\beta=\pi/2$ pulse in the original CRAZED sequence is replaced with a $\pi/3$ pulse. The maximum signal derived from iDQCs is increased by a factor of $3\sqrt{3}/4$. (b) The position of the acquisition window is adjusted, and a large acquisition window (small bandwidth) is used to sample a broad range of time-domain signals. (c) Receiver dynamic range is optimized. (d) A two-step phase cycle scheme for iDQC-encode gradients is designed to remove additional undesired coherence pathways.

16 Claims, 5 Drawing Sheets

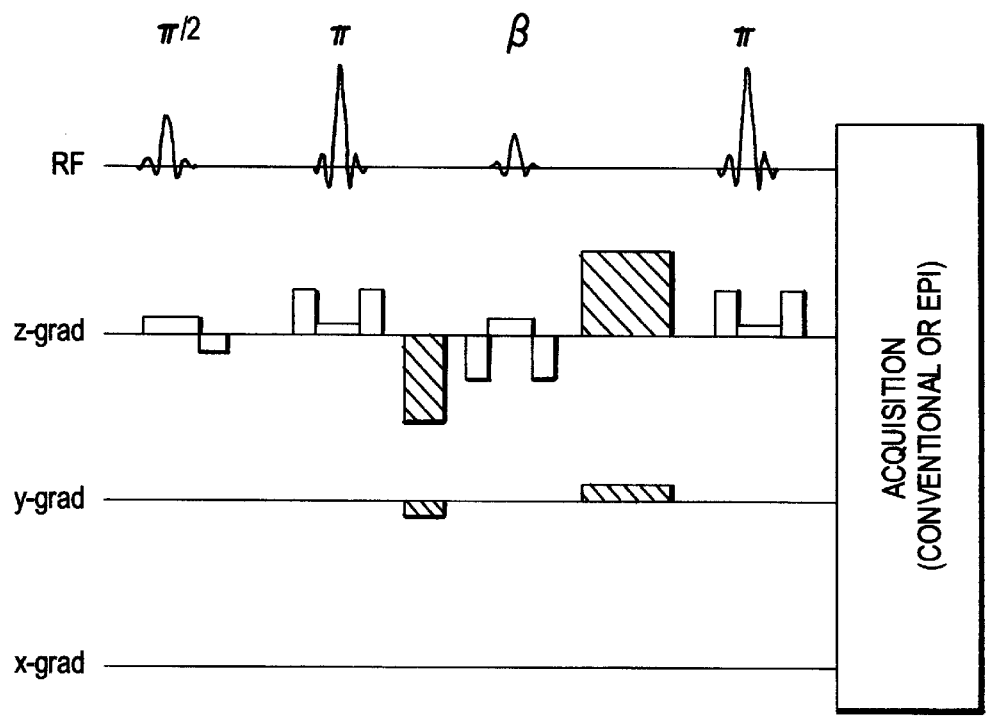
FIG. 3
FIG. 6A
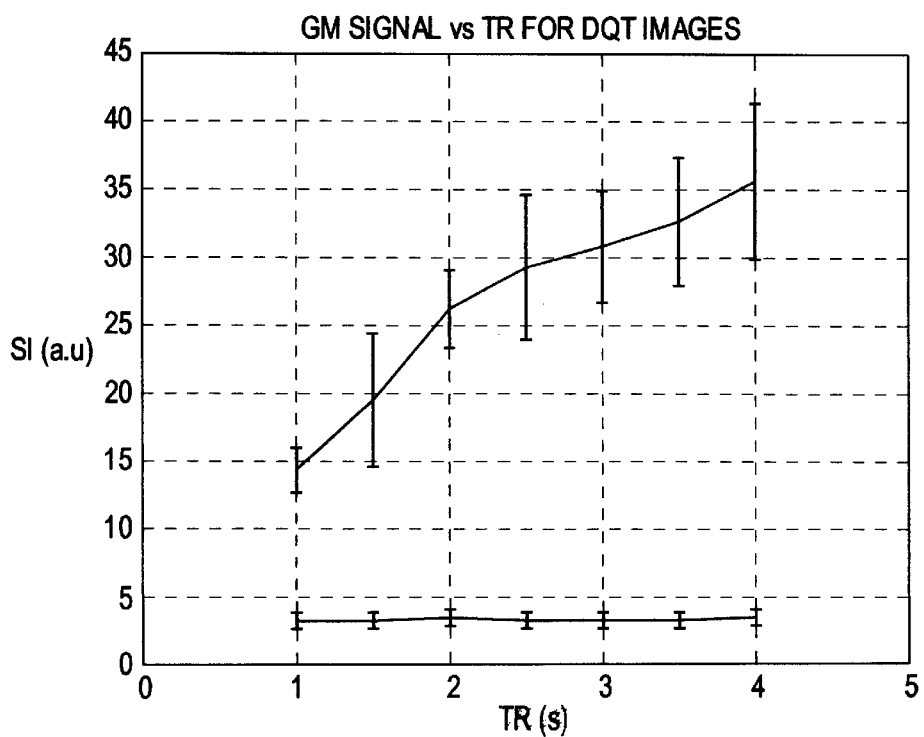

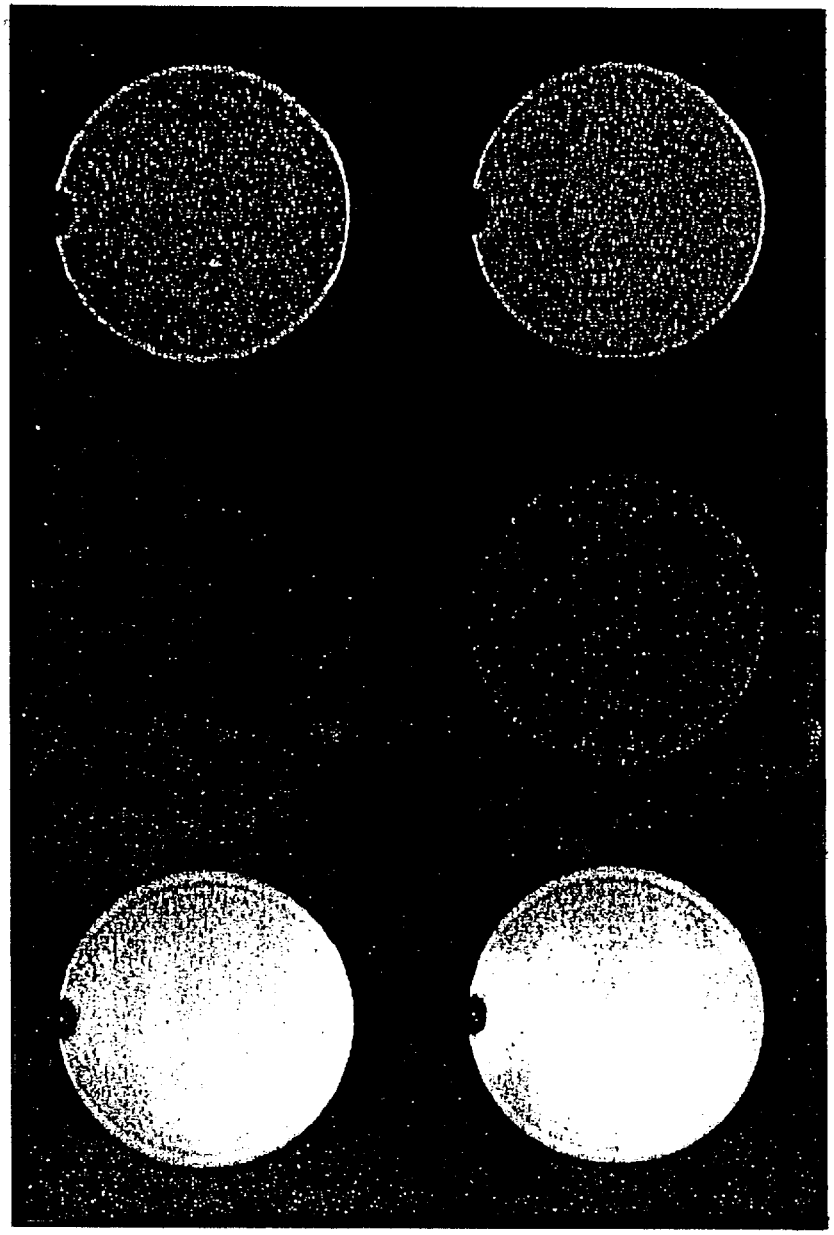

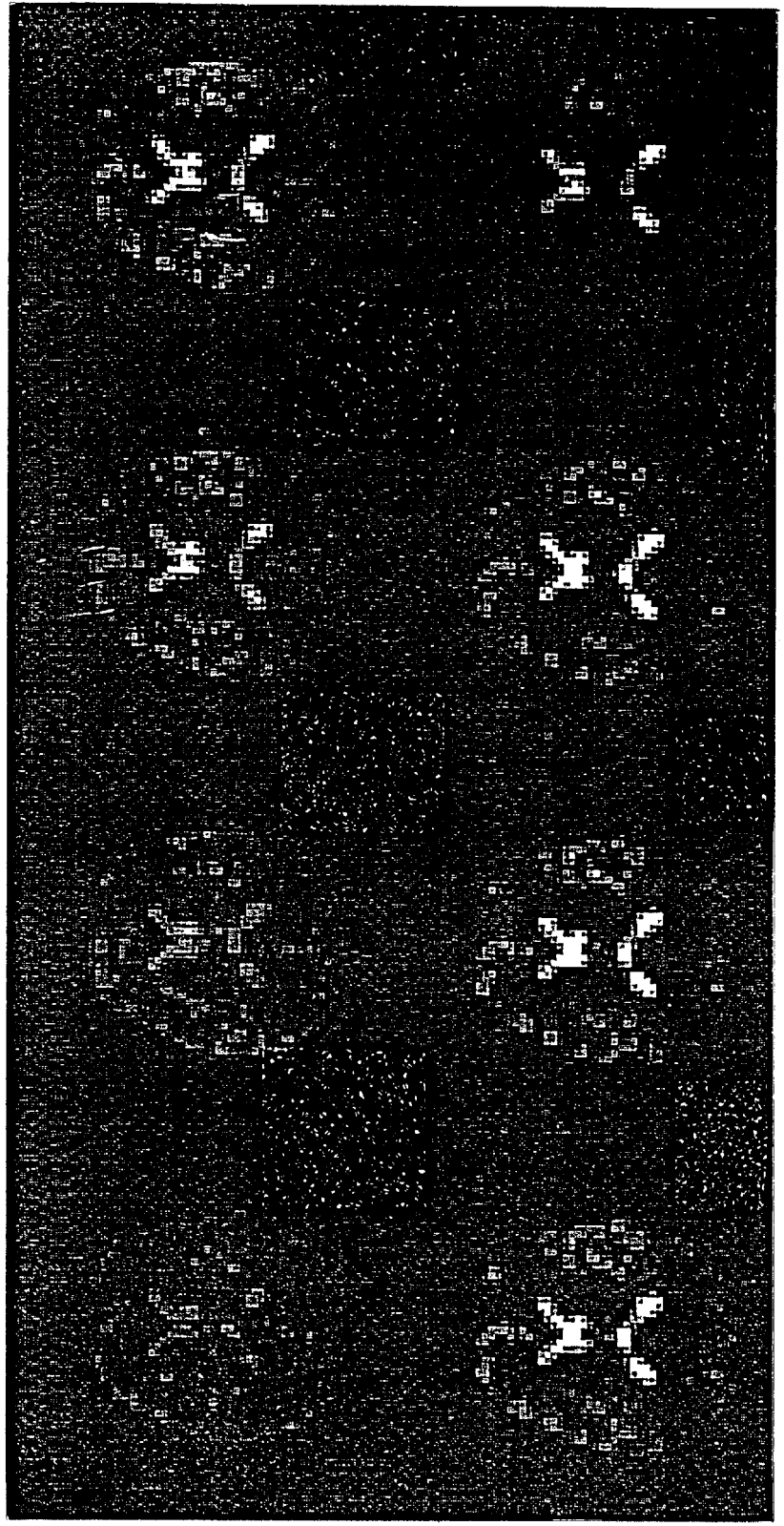

INTERMOLECULAR MULTIPLE-QUANTUM COHERENCE MR IMAGING IN HUMANS

REFERENCE TO RELATED APPLICATION

The present application claims the benefit of U.S. Provisional Application No. 60/190,093, filed Mar. 20, 2000, whose disclosure is hereby incorporated by reference in its entirety into the present disclosure.

STATEMENT OF GOVERNMENT INTEREST

The work leading to the present invention was supported (via salary support and equipment use for the inventors, for a related project however with no current invention proposed in the grant application) by the U.S. Public Health Service with grant No. NS32024 from the National Institutes of Health. The government has certain rights in the present invention.

FIELD OF THE INVENTION

The present invention is directed to magnetic resonance (MR) imaging and more particularly to such imaging using intermolecular double-quantum coherence (DQC) for soft tissue contrast in human subjects.

DESCRIPTION OF RELATED ART

Intermolecular multiple quantum coherence (iMQC) among water spins is a physical phenomenon that possesses many interesting characteristics. The iMQC originates from dipolar interactions among spatially separated water nuclear spins, and the signal intensity from iMQC depends on, among other things, a correlation distance for the dipolar interactions which can be selected with experimental parameters. The potential use of this signal source to form MR images with novel contrast is tremendous, but very little work has been done in the past, due to a lack of sound understanding of factors affecting the formation, signal-to-noise ratio, and contrast of the images.

One particular form of iMQC is DQC, or double quantum coherence. DQC was mentioned briefly in W. S. Warren et al, "Generation of impossible cross-peaks between bulk water and biomolecules in solution NMR," *Science* 1993; 262:2005–2009. However, that article is primarily concerned with ZQC (zero-quantum coherence) and teaches that the correlation gradient eliminates all but the ZQCs.

Multiple spin echoes (MSEs) and intermolecular multiple-quantum coherences (MQCs) in highly polarized systems have generated tremendous interest but also controversy in the NMR community over the past few years. These phenomena have been described using either classical theory for the demagnetizing field or quantum-mechanical density matrix treatments. To date, both treatments have led to fully quantitative predictions of the signals for simple sequences, such as correlated 2D spectroscopy (COSY) or COSY Revamped by Asymmetric Z gradient Echo Detection (CRAZED) experiments. Warren et al have determined the connection between the demagnetizing field and intermolecular dipolar coupling. The residual dipolar couplings between distant spins are responsible for the dipolar demagnetizing field and give rise to the intermolecular MQCs. From the classical viewpoint, these phenomena are due to the demagnetizing field produced by the spatial modulation of the nuclear magnetization arising in the sample following the second pulse in the CRAZED sequence. Though there are still some theoretical issues which remain to be addressed, intermolecular dipolar interaction effects have lost much of their mystical character and are becoming useful tools in NMR. Recently there has been great interest in the potential of the MQC or MSE contrast mechanisms for MRI because these contrast mechanisms may provide improved detection of tumors and eliminate the need for contrast agent injection.

Warren and co-workers first proposed intermolecular zero-quantum coherence (ZQC) imaging which is insensitive to the magnetic field inhomogeneity and has a relatively higher signal-to-noise ratio (SNR) than other MQCs. They have obtained ZQC images with varying contrast which reveal structural features not seen in conventional MR images. However, DQC imaging utilizing the prototype sequence $90°\text{-}t_1\text{-}\{\text{gradient}\}\text{-}90°\text{-}\{\text{double-area gradient}\}\text{-}t_2$, was believed to be unable to result in meaningful signals from the DQCs with a long detection time $t_2$ and a short evolution $t_1$, which are the preferred conditions for imaging. Navon and co-workers used $^1$H double-quantum filtered (DQF) MRI to detect molecules associated with ordered structures, thus identifying a new type of contrast. That method, however, only detects signals from semi-solid constituents and is specific for imaging of connective tissues such as cartilage and tendons. Based on classical demagnetization field theory, van Zijl and co-workers attempted to form an image from the second spin echo, but found that the image had a very low SNR and no detectable contrast even at the high field strength of 4.7 T. Recently, Bifone and co-workers showed that MSE spectroscopic signals in a localized volume can be observed in vivo with a 1.5 T clinical MR scanner. However, the sensitivity of the detected signal was too low for MR Imaging. However, the experimental parameters for the acquisition of the signal from the DQCs were not optimized in these previous reports.

SUMMARY OF THE INVENTION

It is a primary object of the invention to develop an MRI imaging method based on MQC, and in particular on DQC. It is a further object of the invention to develop such an imaging method for soft tissue imaging in humans.

To achieve the above and other objects, the present invention is directed to a method of forming MR images using a source of signals that have previously been considered as either non-existent or too difficult to be detected. Theoretical analysis and computer numerical simulations have been used to characterize the behavior of spins undergoing multiple-quantum coherences (MQCs) and to design an optimal imaging acquisition scheme. The present invention permits double-quantum coherence (DQC) MR images in human brains. The invention also permits human brain multiple-quantum coherence images to be taken using a 1.5T NMR scanner. A theoretical analysis has been carried out, demonstrating how the signals from MQC should change as function of magnetic field strength, and has permitted the determination of the relative sensitivity of MQCs of different transition orders.

A combination of quantum and classical formalisms was used to describe the behavior of the evolution of nuclear spins, including the effects of relaxation and long-range dipolar interactions. Theoretical analysis was used to aid in the design of a DQC imaging sequence with conventional or echo planar imaging acquisitions on a 1.5T clinical scanner.

In spite of the relatively low sensitivity, DQC images of human brains have been obtained for the first time with acceptable signal-to-noise ratio on a whole-body 1.5 T scanner. The theoretical analysis suggests that signals from the intermolecular DQCs have sensitivity better than those from the zero-quantum coherence (ZQCs) for human brain imaging. Signals from non-DQCs were filtered out by selective magnetic field gradients, and signals from ZQCs were further suppressed through application of a two-step cycling of the gradients. Other experimental adjustments such as an adaptive receiver gain, longer TR, and increased acquisition windows were used to maximize the available signal. Images in phantoms and human brains demonstrate that the imaging sequence has excellent selection for the signal from DQCs. These images demonstrate contrast of various brain tissues different from conventional images. It reflects susceptibility variations over adjustable sub-voxel distances. When the pulse sequence was implemented with EPI acquisition, whole brain DQC images of reasonable signal-to-noise ratios can be obtained in less than a minute.

Acquisition of the human brain images based on DQCs in water was successfully achieved for the first time on a 1.5T clinical scanner. The DQC signal provides new contrast for the detection of varying microstructure in soft tissues, which may potentially improve detection of tumors, and supply a new imaging tool for human brain functional studies.

The theoretical analysis shows that the present methods using DQC provide higher sensitivity than what was presented previously by Warren et al using ZQC. This higher sensitivity persists at all imaging field strengths. Experiments confirm the conclusions.

A new methodology is provided for using the DQC to study tumor oxygenation, human brain functional activation, and molecular diffusion imaging.

Pulse sequences, acquisition schemes, and gradient waveforms allow most efficient acquisitions of iMQC signals, and specific quantitation of different parameters.

The present technique will have large impacts on the research and clinical applications in which MRI is used.

Specifically, there are several technical developments which distinguish the present invention over the work of Warren et al:

1. The present invention permits calculation of the relative sensitivity of DQC and ZQC signals and successful implementation of DQC images for humans.
2. The present invention incorporates several measures in the imaging pulse sequence design to achieve optimal sensitivity for iDQC signal detection: (a) The $\beta=\pi/2$ pulse in the original CRAZED sequence was replaced with a $\pi/3$ pulse. The maximum signal derived from iDQCs is increased by a factor of $3\sqrt{3}/4$. (b) The position of the acquisition window is adjusted, and a large acquisition window (small bandwidth) is used to sample a broad range of time-domain signals. (c) Receiver dynamic range is optimized. In the implementation of DQC imaging disclosed herein, the default coil configuration file for the GE quadrature head coil was modified to increase the reconstruction scale by 18 dB during acquisition of DQC images. (d). A two-step cycle scheme-of DQC-encode gradients was designed to remove other undesired coherence pathways. A pair of gradients of very small amplitude along the y-direction before phase-encode gradients is used to eliminate the residual contamination from coherences other than DQCs.
3. The present invention implements DQC imaging pulse sequences with the following options: (1) without any refocusing $\pi$ pulses during DQC evolution and detection periods (referred to as GRE-DQC); (2) with refocusing $\pi$ pulses during DQC detection period only (referred to as SE-DQC); (3) with refocusing $\pi$ pulses during both iDQC evolution and detection periods (referred to as $2\pi$-DQC). Contrast in images depends on the use of these refocusing pulses in the evolution and detection periods. These properties of our pulse sequence design were tested with brain fMRI studies.
4. DQC pulse sequences have been designed to measure diffusion rates of DQC and proved the apparent diffusion coefficient of DQC to be twice as large as SQC diffusion coefficient. Using the DQC diffusion weighted imaging, sensitivity to molecular diffusion will be twice as much as the conventional SQC DW imaging using the same diffusion gradient parameters
5. The DQC imaging technique has the enhanced sensitivity to local magnetic susceptibility variations which may be more sensitive to changes in blood oxygenation related to human brain neuronal activation.

Based on the same principles as outlined above for the pulse sequences, different iMQC imaging sequences and acquisition strategies can be implemented, including EPI in 3D, combined gradient-echo and spin-echo, spiral scan, keyhole, and back-projections. Due to the different behaviors of iMQCs with k-space sampling strategies, acquisition window positions, receiver bandwidth, and multiple-echo acquisitions, optimization of these parameters can result in improvements in signal-to-noise ratios for iMQC imaging. New applications can be based on the favorable features of iMQCs, including their selectivity to dipolar interactions of adjustable spatial scales, their higher sensitivity to molecular diffusion, and their long lasting signals in time domain. The inventors have performed a series of preliminary works on intermolecular multiple-quantum coherence imaging, and have established some important basis and understanding for further development of this potentially very useful technique. A combination of quantum mechanical and classical formalisms is used to describe the behavior of the evolution of nuclear spins under long-range dipolar interactions, in the presence of relaxation and molecular diffusion. Theoretical analysis is used to aid in the design of DQC imaging sequences with conventional or echo planar imaging acquisitions. For the first time, DQC images have been obtained of human brains on a whole-body 1.5 T scanner. Some important results from those works are summarized below:

1. Characteristics of MQC signals with quantum mechanical and classical theories. Intermolecular dipolar effects in highly polarized spin systems such as water have been studied. Expressions for iMQCs under the influence of magnetic field gradients of varying magnitudes, directions, and durations were explicitly derived with the density matrix formalism and demagnetizing field theory. The time-averaged, not instantaneous, orientation of the applied gradients determines the contributions of long-range intermolecular dipole effects to multiple-quantum coherences. The time-averaged gradients served as a general model for gradients used for iMQC selection in imaging sequences. Theoretical and experimental results demonstrate, for the first time, that when the time-averaged orientation of a series of gradient pulses during the evolution period is at the magic angle, intermolecular dipolar effects are suppressed. The experimental evidence presented strongly supports the theoretical predictions and provides basis for coherence-select gradient designs for iMQC imaging.
2. With the apparent diffusion rates for MQC diffusion, $D_n^{app}$, defined as the slope of the MQC signal intensity vs. diffusion weighting gradients, the apparent diffusion rates of intermolecular MQCs are different from that of the intra-molecular MQCs; they follow the relationship: $D_n^{app} = nD_T$, where $D_T$ is the translational molecular diffusion coefficient. These results coincide with neither $D_n^{app} = n^2 D_T$ for the ordinary MQC model nor $D_n^{app} = D_T$ for the simple classical demagnetizing model.

3. The inventors have designed pulse sequences which allow detection of signal decay solely depending on either iMQC relaxation or diffusion during the evolution period, and pulse sequences with selective excitation of specific nuclear spins interacting with different spins. These developments allow us to probe iMQCs during different time period to provide answers to some basic questions concerning MQC.

4. It is demonstrated that both the ZQC and DQC signal intensities increase with increased static field strengths. The advantage of DQC over ZQC in sensitivities, however, remains with increased field.

5. When signal intensity from a DQC image is measured as a function of echo time TE in human brains, a maximum in signal vs. TE appears when TE equals $T_2$. There is a good agreement between the detected signal changes and the theoretical prediction for the GM and WM of the brain.

When the MQC signals are detected with varying τ, the signal attenuation during this period depends on $T^*_{2,n}$, which is a sum of the contributions of the intermolecular MQC $T_{2,n}$ and the magnetic field inhomogeneities. An estimate of signal losses during the evolution and fitting to the theoretical curve to measured signal integrals can thus provide a measure of the MQC transverse relaxation time, $T_{2,n}$ or $T^*_{2,n}$.

We have implemented iDQC imaging pulse sequences at 1.5, 4 and 7 T with the following options: (1) without any refocusing π pulses during iDQC evolution and detection periods (referred to as GRE-iDQC); (2) with refocusing π pulses during iDQC detection period only (referred to as SE-iDQC); (3) with refocusing π pulses during both iDQC evolution and detection periods (referred to as 2π-iDQC). Contrast in images depends on the use of these refocusing pulses in the evolution and detection periods.

BRIEF DESCRIPTION OF THE DRAWINGS

A preferred embodiment of the present invention will be set forth in detail with reference to the drawings, in which:

FIG. 3 is a plot of a pulse sequence used in DQC imaging;

FIGS. 4A–4F show experimental results taken with a water phantom;

FIGS. 5A–5H show the TE dependence of the DQC image of a human brain; and

FIGS. 6A–6C are plots showing signal intensities for GM, WM and CSF as functions of TR.

DETAILED DESCRIPTION OF THE PREFERRED EMBODIMENT

A preferred embodiment of the present invention will now be set forth in detail with reference to the drawings.

Figure 1:
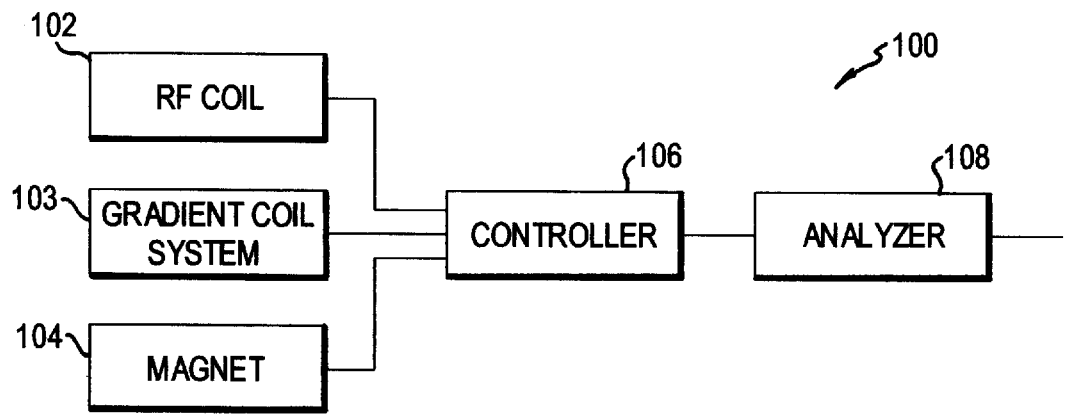
FIG. 1 is a block diagram of an imaging system on which the preferred embodiment can be implemented.

FIG. 1 shows an overview of a system 100 on which the preferred embodiment can be implemented. An RF coil 102, a gradient coil system 103 and a magnet 104 supply the fields used in imaging under the control of a controller 106. An analyzer 108 such as an SGI workstation analyzes the data to form an image. While the system 100 can be implemented on any suitable equipment, it has been implemented on a GE SIGNA (Horizon 5.7) 1.5 T MR scanner (GE Medical Systems, Milwaukee, Wis., U.S.A.) with maximum gradient strength of 23 mT/m and maximum gradient switched rate of 120 mT/m/ms. The analyzer 108 can be any sufficiently powerful workstation.

The theoretical and experimental considerations of using the device 100 or any other suitable device for DQC imaging will now be discussed.

Relative Signal Intensity of DQC, ZQC and SQC for Imaging

In order to study the feasibility of in vivo DQC imaging, it is necessary to estimate the relative signal intensities for DQCs and ZQCs. Because both classical and quantum treatments have led to fully quantitative predictions of the signals for the CRAZED sequence, the MQCs description will be used for illustrative purposes in this paper. Warren et al have shown that the first pulse (π/2) in the CRAZED sequence, applied to the full thermal equalization density operator, generates MQCs. The MQCs are then converted into SQCs by a second pulse. The complex transverse magnetization originated from the DQCs is given by $$M^+(t_1, t_2) = iM_0 e^{-i2\Omega t_1} e^{i\Omega t_2} \left(\frac{2\tau_d}{t_2 \Delta_s}\right) J_2\left(\frac{-t_2 \Delta_s}{\tau_d}\right), \quad [1]$$

where $t_1$ and $t_2$ are the evolution and detection time respectively; $J_2$ is the second order Bessel function; $\Delta_s = [3(\hat{s}\cdot\hat{z})^2 - 1]/2$, where $\hat{s}$ is the direction of the DQC-encode gradients, and $\hat{z}$ is the static magnetic field direction; $M_0$ is the equilibrium magnetization per unit volume; the dipolar demagnetizing time $\tau_d(\gamma\mu_0 M_0)^{-1}$ where γ is the gyromagnetic ratio and $\mu_0$ is the magnetic permeability constant; Ω is the resonance offset in the rotating frame of reference. The observable signal is therefore proportional to a Bessel function of second order. For a ZQC experiment (replacing the second π/2 pulse with a π/4 pulse), the complex transverse magnetization is:

$$M^+(t_1, t_2) = i\frac{M_0}{\sqrt{2}} e^{i\Omega t_2} J_1\left(\frac{-t_2 \Delta_s}{\sqrt{2}\,\tau_d}\right), \quad [2]$$

where $J_1$, is the first order Bessel function. The effect of radiation damping is very small due to the low Q of the coil on a 1.5 T clinical MRI scanner, and diffusion is relatively small in most cases. However, a complete formalism of the intermolecular dipolar evolutions including relaxation processes is required. The analytical form of the results is useful for the understanding of how changing parameters affect signal intensities and potential imaging contrasts among different tissues. An MQC of a given order, subject to its own relaxation decay during the evolution period, can be transferred into observable SQCs during the detection period. Now the relaxation process of MQCs which occurs during the $t_1$ evolution will be considered, since it is an important parameter for providing contrast in MRI. To simplify the matter, a monoexponential relaxation is assumed for each coherence. The relaxation attenuation, $\exp(-t_1/T_{2,MQ})$, is assigned to the relaxation of MQCs during the evolution period. $T_{2,DQ}$ of DQCs may have relaxation times different from $T_{2,ZQ}$. When the second π/2 pulse is replaced with a π/3 or a 2π/3 pulse in a standard CRAZED sequence, one obtains the maximum signal from DQCs which is 3√3/4 times that of the one given by Eq. [1]. When the transverse relaxation is taken into account during the evolution period, $t_1$, and the detection period, $t_2$, Eq. [1] and [2] should be written as follows:

$$M_{DQ}^+(t_1, t_2) = iM_0 e^{-i2\Omega t_1} e^{i\Omega t_2} J_2\left(\frac{-t_2 \Delta_s}{\tau_d}\right) e^{-t_1/T_{2,DQ}} e^{-t_2/T_2}; \quad [3]$$

$$M_{ZQ}^+(t_1, t_2) = i\frac{M_0}{\sqrt{2}} e^{i\Omega t_2} J_1\left(\frac{-t_2 \Delta_s}{\sqrt{2}\tau_d}\right) e^{-t_1/T_{2,ZQ}} e^{-t_2/T_2}. \quad [4]$$

The signals from the DQCS, which are detectable in an imaging acquisition, can be compared with those from the ZQCs by integrating Eqs. [3] and [4] over $t_2$. Since $e^{-i2\Omega t_1}$ in Eq. [3] can be refocused by a π RF pulse applied at $t_1/2$, it can be neglected in the integration. Similarly, $e^{i2\Omega t_{21}}$ in Eqs. [3] and [4] can be neglected upon integration if a π RF pulse is applied at $t_2/2$. The average transverse relaxation time, $T_2$, for white matter (WM) and gray matter (GM) of a normal human brain are known in the art to be 80 and 100 ms, respectively, at 1.5 Tesla. The average $T_2$ value for cerebrospinal fluid (CSF) is in the range of one second. Previous theories and in vivo measurements suggest that $T_2$ does not change or is reduced only slightly with increasing field strengths. To estimate the relative sensitivities and time evolution of the signals, the following values are used for the numerical integration of Eqs. [3] and [4]: $T_2$=80 ms; selective gradients along z direction, namely, $\Delta_s$=1; integral range $t_2$ from 0.001 to 0.5 s. The lower limit of $t_2$ was set at a small value instead of zero, to assure convergence upon integration. The upper limit of the integral was set according to typical values used for an EPI acquisition. To simplify the calculation and comparison, it is assumed that $T_{2,DQ} \approx T_{2,ZQ}$. The symbolic programming language MATHEMATICA 3.0 (Wolfram Research, Champaign, Ill.) was used to calculate the integration of Eqs. [3] and [4] at different magnetic field strengths for typical scanners. The integral results for $T_2$=80 ms at different field strengths are listed in Table 1. The predicted signal from DQCs based on Eq. [3] and that from ZQCs based on Eq. [4] are drawn as a function of $t_2$ from 0 to 1 s in FIG. 2. The signal values are displayed for a 1.5 T magnetic field strength for both $T_2$=80 ms and $T_2$=300 ms. The theoretical results in Table 1 and FIG. 2 suffice for a qualitative discussion. Theoretical calculations suggest the unexpected results that DQC imaging has a higher sensitivity than ZQC imaging for human brain imaging and that it is feasible to use signals from DQCs to form human brain images at 1.5T. Relative signal intensities for both DQC and ZQC images, as percentages of the SQC signal, increase with the field strength, and the higher sensitivity of the DQCs over the ZQCs reduces only slightly as the field increases. (see Table 1).

The next question which arises is whether or not the signal contribution from DQCs is sensitive to correlation distances as those from ZQCs. Warren et al have shown that signals originate primarily from the DQC spins separated by a distance d=π/(γGτ) (where G is the strength, and τ is the duration of the MQC-encode gradients), or half a cycle of the magnetization helix generated by the correlation gradient. These phenomena are due to the correlation distance produced by the first selective gradient, which is used for creation of signals from both the ZQCs and DQCs in a CRAZED-like sequence. Therefore the signal from DQCs should have similar spatial dependence to that from the ZQCs. Although the correlation distance has an identical influence on DQCs and on ZQCs, the transverse relaxation time of DQCs may be different from that of ZQCs. The transverse relaxation rates of different MQCs contain relevant information that may not be determined from traditional SQC MR imaging. Therefore, DQC imaging may provide a new contrast mechanism analogous to the ZQC imaging.

Design and Optimization of DQC Imaging Sequence

All imaging experiments were performed on a clinical 1.5 Tesla GE SIGNA whole body scanner (GEMS, Milwaukee, Wis.) with a peak gradient strength of 22 mT/m and rise time of approximately 200 μs. A standard GE quadrature birdcage head coil was used to image both human brains and head-coil phantoms. The experimental setup has been explained above with reference to FIG. 1. The brains of three volunteers were imaged using the following imaging parameters: FOV of 30×30 cm; slice thickness of 7 mm; matrix size of 256×64; and acquisition bandwidth of 2.02 kHz.

A CRAZED-like sequence was incorporated into a spin-echo imaging sequence for acquisitions of DQC images (FIG. 3). As is applied in the standard CRAZED pulse sequence for spectroscopic experiments, gradients with a 1:n ratio of total gradient areas before and after the second RF pulse was used to select the n-quantum coherence order. For the DQC, n=±2. The DQCs are excited by the first π/2 pulse, and the second pulse (π/3) transforms the DQCs back to SQCs. Because there is no homonuclear J coupling in water protons, the detected signals result exclusively from the residual dipolar interaction. The first π pulse refocuses chemical shifts and magnetic field inhomogeneities while retaining long-range dipolar couplings. The second π pulse removes effects of inhomogeneity and chemical shift. When the second π/2 pulse in the standard CRAZED experiments is replaced with a π/3 (for n=−2 quantum transition) or a 2π/3 (for n=+2 quantum transition) pulse, the maximum signal from DQCs is increased by a factor of 4. It is simpler to design a smaller flip angle for uniform excitation, so a π/3 pulse (n=−2) was used for the second RF pulse. The phase encoding and dephasing pulses for the readout gradient were placed immediately before acquisition to avoid any interactions with coherence selections. It is very important to choose optimal parameters for DQC imaging because of its

TABLE 1

| Magnetic field strength (T) | 9.4 | 8.5 | 4.7 | 4.0 | 1.5 |
|---|---|---|---|---|---|
| Dipolar demagnetizing time $\tau_d$ (ms) | 100 | 110 | 200 | 235 | 630 |
| $S_{DQ} = \int_{0.0001}^{0.5} M_{DQ}^+(t1,t2)dt_2$ | 0.16 $M_0$ | 0.14 $M_0$ | 0.048 $M_0$ | 0.035 $M_0$ | 0.0052 $M_0$ |
| $S_{ZQ} = \int_{0.0001}^{0.5} M_{ZQ}^+(t1,t2)dt_2$ | 0.13 $M_0$ | 0.11 $M_0$ | 0.037 $M_0$ | 0.027 $M_0$ | 0.0040 $M_0$ |
| Relative intensity $S_{DQ}/S_{ZQ}$ | 1.23 | 1.27 | 1.30 | 1.30 | 1.30 |
| Peak position for DQC (ms) | 73 | 74 | 78 | 79 | 82 | low sensitivity in comparison with conventional SQC imaging. According to FIG. 2, the signal from brain tissue DQCs (T2=80 ms) remains about 0.5 s in $t_2$ with a maximal value at 0.08 s. For tissue fluid with a long $T_2$ component such as CSF, the signal from DQCs reaches its peak value at 0.28 s. In order to obtain a high SNR for maximum sampling of the signal, a short acquisition bandwidth (a large acquisition window) is needed. A TE close to the peaks of maximum signals for brain tissues and CSF is also required. In the experiment, the inventors typically chose TE=0.14 s, a minimum available acquisition bandwidth 2.02 kHz (approximately 0.06 s for the acquisition time) and π/3 for the second RF pulse. These near optimal parameters warrant a relatively high SNR for DQC imaging.

Figure 2:
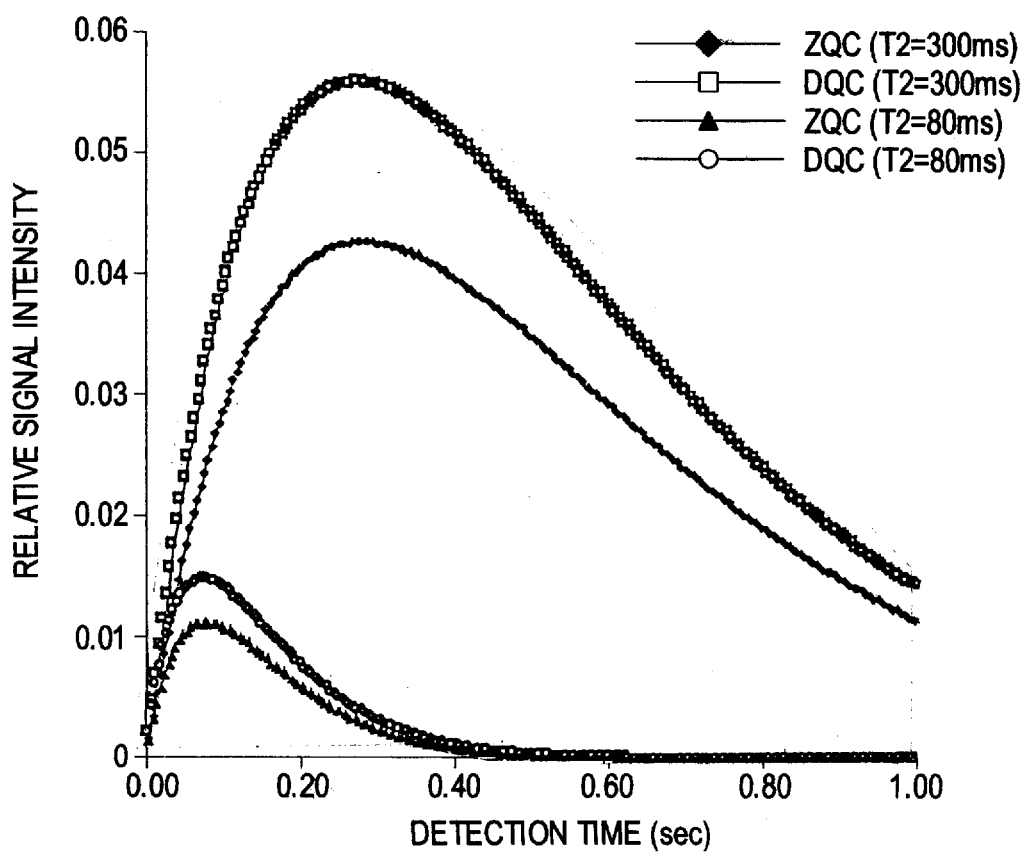
FIG. 2 is a plot of the relative signal intensities of DQC and ZQC for two values of $T_2$.

An additional factor, which may result in poor SNR in DQC imaging, is the finite dynamic range of analog-to-digital converters (ADC) for receivers. Under the optimal condition, the signal from DQCs shown in FIG. 2 is less than 1/60 that of the conventional SQC signal. A conventional 16-bit ADC does not have the proper dynamic range to handle the signals from DQCs if one uses a standard setting of the receiver gain. Because a very high level suppression of the conventional SQC signal was achieved with the DQC imaging sequence, adjusting the receiver gain is the simplest means for increasing the dynamic range of the digitizer. In the implementation of DQC imaging disclosed herein, the default coil configuration file for the GE quadrature head coil was modified to allow the coil preamp gain and reconstruction scale for images to increase by 18 db during acquisition of DQC images. Following adjustment of the receiver gain, the dynamic range for the signal was increased by nearly two orders of magnitude. The procedure certainly improves MR image quality under conditions where the image noise is dominated by the digitization artifact. In such cases, increasing the receiver gain without causing an ADC overflow provides an increase in the SNR and contrast of the resulting image. It is worth noting that the nature of the single-scan DQ coherence selection allows the use of high receiver gain. This is not possible for ZQC experiments where phase cycling is used to select the ZQCs, because of this much more high-intensity artifactual signal can come in, and the receiver gain cannot be optimized for the low sensitive MQC signal.

There is an additional factor which crucially affects the imaging quality of MQC MRI: selection of specific signals from MQCs. Because of slight imperfections in the RF pulse flip angles, gradient waveforms etc, additional phase cycling of RF pulses and/or that of MQC encode gradients are often necessary. Warren and co-workers have recently demonstrated successful ZQC imaging using either subtraction of two acquisitions with phase cycling of the second RF pulse between π/4 and 3π/4, or with the addition of two acquisitions with the ZQC-sensitive gradients along the z or x directions. However, due to slice-selection requirements for imaging, it is more difficult to have a precise flip angle setting (π/4 or 3π/4) for the second pulse in ZQC imaging experiments. This may result in errors in cancellation of large SQC signals using only a phase cycling of RF pulses. When the z-x gradient two-step cycling is used, since the signal from ZQCs is 1.5 times that of a single acquisition and the noise is $\sqrt{2}$ times, a SNR improvement of only a factor of 1.5/1.42=1.06 is achieved with the addition of two acquisitions. A phase cycle of MQC-encode gradients may provide a better way to suppress conventional SQC signals and achieve higher SNR (proportional to $\sqrt{NEX}$, where NEX is the number of excitations) in ZQC or DQC imaging experiments. In addition, in DQC imaging, the contribution from the zero quantum term must also be considered carefully, because it is not affected by static field inhomogeneity or by phase-cycling, and its signal decay due to the transverse relaxation is in some cases quite slow. In the present invention, in order to achieve a pure DQC image, a two-step cycle scheme of DQC-encode gradients was designed to remove other coherence pathways, especially shifted stimulated echoes produced from ZQCs. As shown in FIG. 3, a pair of gradients of very small amplitude (with approximately 1/10 the amplitude of the z-direction gradients) along the y-direction before phase-encode gradients is used to eliminate the residual contamination from coherences other than DQCs. The polarity of the gradient pair is alternated for each RF excitation (NEX). Similarly to ZQC imaging, DQC imaging (with signals originated from $I_1^+I_2^+$ or $I_1^-I_2^-$) exaggerates spin density variations due to uniform proton density. On the other hand, detected signals originated in DQCs, $I_1^+I_2^+$ or $I_1^-I_2^-$ result from the spin states $I_{1z}I_{2z}$. In order to allow the signal from DQCs to recover from saturation, it is more important to use a relatively long TR to achieve sufficient recovery of the longitudinal magnetization. Intuitively, if each spin population recovers with its own $T_1$, a 50% recovery for each spin population results only in a 25% recovery of the full signal intensity.

RESULTS AND DISCUSSION

To verify that the signal obtained with the imaging sequence in FIG. 3 is from DQCs and not from a leakage of SQCs through the DQC encode gradients, different measurements were made in phantoms. Experiments were performed with the DQC-encode gradients applied along the static magnetic field ($B_0$) direction, along the magic angle with respect to $B_0$, and along the directions perpendicular to $B_0$. The theoretical treatment predicts that intermolecular dipole-dipole interactions vanish when magnetic field gradients are applied at the magic angle. With the DQC-encode gradients applied along the directions perpendicular to the $B_0$ field, the detected signal intensity from DQCs should be half of that acquired when the DQC-encode gradients are along the $B_0$ direction. FIGS. 4A–4F show the results. In FIGS. 4A–4C, the polarity of the DQC gradients in the y direction was alternated with each NEX, while in FIGS. 4D–4F, no alternation was used. The DQC encode gradients were applied along the direction of $B_0$ in FIGS. 4A and 4D, along the direction of the magic angle in FIGS. 4B and 4E, and along the direction perpendicular to $B_0$ in FIGS. 4C and 4F. As expected, the results shown in FIGS. 4A–4F demonstrate that a signal minimum is observed when the gradients are at the magic angle, and the signal is approximately half when the gradients are along the directions perpendicular to $B_0$. Comparing images in FIGS. 4A–4C with those in FIGS. 4D–4F, it is evident that the two-step cycling scheme is quite effective in eliminating coherences other than the DQC. Signal intensities along different directions of DQC gradients agree well with predictions of the MQC theory for images acquired with cycling of the DQC-encode gradients. Hence, it can be concluded that the observed signal is originated primarily from the DQCs between water protons. In acquisitions with sufficient SNR where a two average per phase-encode is sufficient, the two-step gradient cycle scheme render it unnecessary the use of the six-step cycling proposed in the prior art to suppress signals from SQCs.

DQC images in a brain slice with different TE values are displayed in FIGS. 5A–5H, in which the TE values are, respectively, 58, 88, 148, 198, 318, 588, 888 and 1898 ms. There are apparent changes in contrast with TE among different type of tissue. Also, the signal intensities in the CSF space increase with TE. With ROI analysis, it was found that signal intensities in the GW and WM decrease with TE but at rates different from that of conventional SQC imaging, and deviate from exponential decays. The apparent paradox of the CSF signal "growth" with increases in TE is in accordance with the predictions for signal changes shown in FIG. 2 for long $T_2$ spins.

Figure 6B:
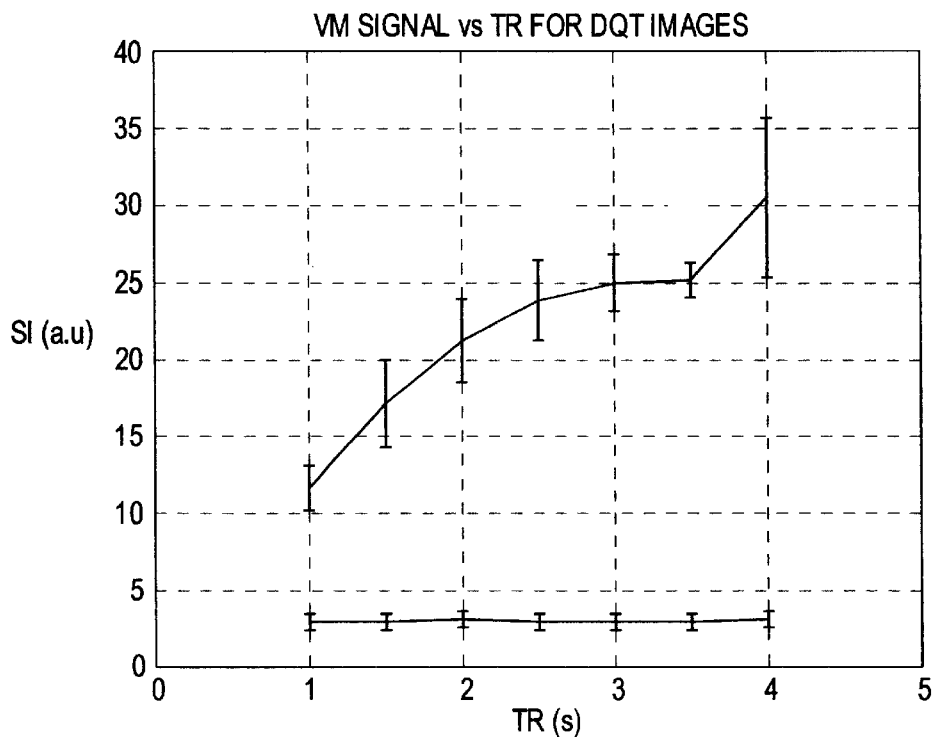
Figure 6C:
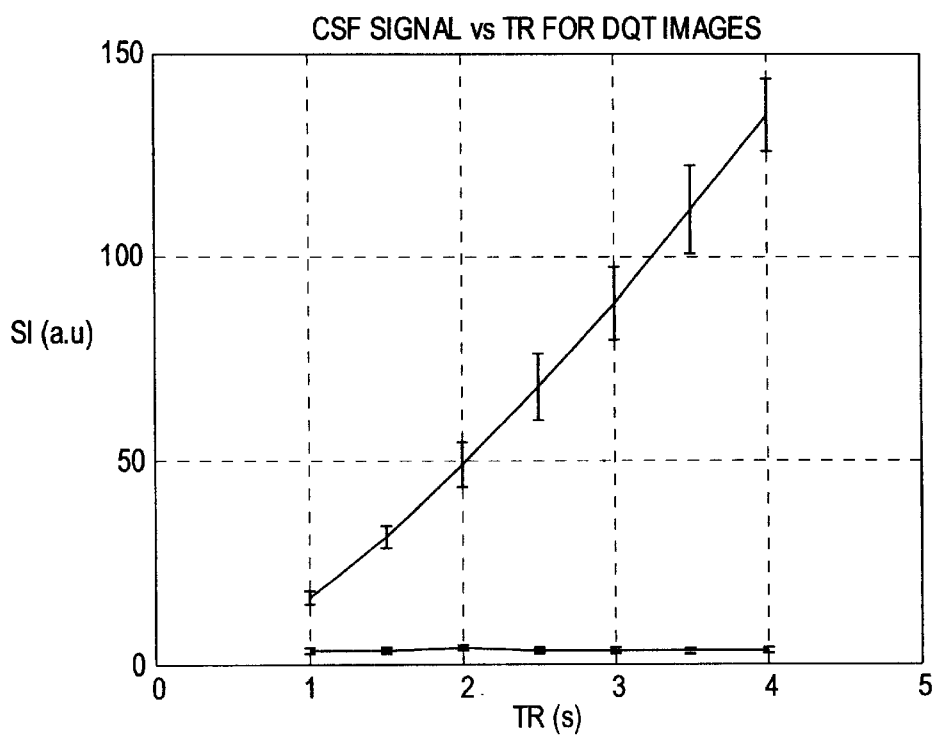

Signal intensities for GM, WM and CSF from 12 ROIs. for each tissue type selected in 3 brain slices, are plotted as functions of the DQC evolution time in FIGS. 6A–6C. A non-exponential decay is seen in brain tissues, but image contrasts among the three types of tissues remain unchanged in the range measured. The order of signal strengths for different tissues is also the same as the $T_2$ decay in SQC signals. Equations [3] and [4] are based on the assumption of a monoexponential relaxation process with selection of a coherence pathway p=(−2,−1) or Δp (−2,1) for DQCs, and p=(0,−) or Δp=(0,−1) for ZQCs. Quantitative determination of relaxation times, $T_{2,DQ}$, requires an estimate of signal losses due to relaxation process during the varying evolution times. The imaging data at 1.5 T to this point does not permit a more quantitative evaluation of the relaxation process. The measurement of relaxation time $T_{2,DQ}$ may provide a new MRI contrast parameter. The signal during the evolution period is also affected by diffusion effects, since a magnetic field gradient of 22 mT/m for 2.5 ms was applied during the $t_1$ period, and a gradient of 22 mT/m for 5 ms was applied during the $t_2$ period. Though the sequences for measuring $T_2$ and $T_{2,DQ}$ differed only in the TE, signals from DQCs and SQCs have different apparent diffusion rates. The actual signal attenuation will result from the coordinated effect between DQC relaxation and diffusion.

DQCs and ZQCs are twins among possible MQCs for imaging of a multispin system, and theoretical analysis suggests that the potential sensitivity for imaging is similar for both types of signal. The choice of DQC or ZQC imaging should therefore be based more on convenience and the need for solving a particular problem. In principle, the DQC imaging method only needs a single scan to obtain an MR image, whereas the ZQC imaging method requires at least two scans followed by post-processing to acquire pure ZQC images. The DQC imaging has higher SNR per unit time and is free from errors due to subtraction. The problem of a lower sensitivity for DQC imaging compared with the conventional SQC imaging can be mitigated by scanning at higher magnetic field strengths. For imaging at all field strengths, the sensitivity of DQC imaging can be still further optimized. An important gain in the sensitivity of DQC imaging may be in use of schemes with long acquisition time such as EPI.

In the multi-pulse design such as in this DQC imaging sequence, spins with different excitation history may manifest themselves, in the final signal. One of the potential "contaminators" in the DQC acquisition is the signal from perfusing blood into the imaging slice. However, in perfusion imaging acquisition such as with FAIR, a delay on the order of 1 sec after spin labeling is usually used to allow labeled spins to enter into the imaging slice, whereas in the DQC acquisition presented here, the optimal time between the first DQC excitation and acquisition is on the order of T2 for the sample. This time can be close to what is used in FAIR in certain circumstances, such as for the optimal acquisition of a long-$T_2$ component. In addition, with the DQC acquisition scheme, most of the SQC signal which leaked into the image slice is dephased by the second DQC gradient, This is not the case for the ZQC imaging method.

While a preferred embodiment of the present invention has been set forth in detail above, those skilled in the art who have reviewed the present disclosure will readily appreciate that other embodiments can be realized within the scope of the invention. For example, teaching of specific equipment is illustrative rather than limiting, as is the disclosed use with the imaging of the human brain. Therefore, the present invention should be construed as limited only by the appended claims.

We claim:

1. A method for magnetic resonance imaging of an object, the method comprising:

providing a magnetic resonance imaging device having RF and gradient field coils and an image analysis device;

using the coils, applying an imaging sequence to the object for exciting intermolecular double quantum coherence between water molecules in the object;

receiving signals form the object produced by the intermolecular double quantum coherence; and using the image analysis device, forming an image of the object from the signals.

2. The method of claim 1, wherein the imaging sequences comprises gradients for filtering out signals other than the signals produced by the intermolecular double quantum coherence.

3. The method of claim 2, wherein the imaging sequence further comprises double quantum coherence encode gradients applied along a static magnetic field direction.

4. A method for magnetic resonance imaging of an object, the method comprising:

providing a magnetic resonance imaging device having RF and gradient field coils and an image analysis device;

using the coils, applying an imaging sequence to the object for exciting double quantum coherence in the object;

receiving signals from the object produced by the double quantum coherence; and using the image analysis device, forming an image of the object from the signals;

wherein the imaging sequence comprises:

a plurality of RF pulses including a second RF pulse;

gradients with a 1:n ratio of total gradient areas before and after the second RF pulse; and n=±2.

5. The method of claim 4, wherein n=2.

6. The method of claim 5, wherein the second RF pulse is a π/3 pulse.

7. The method of claim 4, wherein n=+2.

8. The method of claim 5, wherein the second RF pulse is a 2π/3 pulse.

9. A system for magnetic resonance imaging of an object, the system comprising:

coils for applying an imaging sequence to the object;

a controller for controlling the coils to apply the imaging sequence to the object such that the imaging sequence excites intermolecular double quantum coherence between water molecules in the object; and an imaging device for receiving signals from the object produced by the double quantum coherence and for forming an image of the object from the signals.

10. The system of claim 9, wherein the imaging sequence comprises gradients for filtering out signals other than the signals produced by the intermolecular double quantum coherence.

11. The system of claim 10, wherein the imaging sequence further comprises double quantum coherence encode gradients applied along a static magnetic field direction.

12. A system for magnetic resonance imaging of an object, the system comprising:

coils for applying an imaging sequence to the object;

a controller for controlling the coils to apply the imaging sequence to the object such that the imaging sequence excites double quantum coherence in the object; and an imaging device for receiving signals from the object produced by the double quantum coherence and for forming an image of the object from the signals;

wherein the imaging sequence comprises:

a plurality of RF pulses including a second RF pulse;

gradients with a 1:n ratio of total gradient areas before and after the second RF pulse; and n=±2.

13. The system of claim 12, wherein n=-2.

14. The system of claim 13, wherein the second RF pulse is a $\pi/3$ pulse.

15. The system of claim 12, wherein n=+2.

16. The system of claim 15, wherein the second RF pulse is a $2\pi/3$ pulse.

* * * * *